(12) United States Patent  
Hino et al.

(10) Patent No.: US 7,527,658 B2  
(45) Date of Patent: May 5, 2009

(54) METHOD OF MANUFACTURING DISPLAYS AND APPARATUS FOR MANUFACTURING DISPLAYS

(75) Inventors: Terushige Hino, Kikuchi-gun (JP); Kazuaki Tanoue, Kikuchi-gun (JP); Eiji Shibata, Kikuchi-gun (JP); Takuji Oda, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 307 days.

(21) Appl. No.: 11/179,527

(22) Filed: Jul. 13, 2005

(65) Prior Publication Data

US 2006/0014395 A1     Jan. 19, 2006

(30) Foreign Application Priority Data

Jul. 15, 2004     (JP)     ............... 2004-208206

(51) Int. Cl.  
*H01L 21/00*     (2006.01)
(52) U.S. Cl. ............... 29/25.01; 257/E21.218; 118/723 E; 118/715; 118/723 R; 156/916
(58) Field of Classification Search ............. None  
See application file for complete search history.

(56) References Cited

U.S. PATENT DOCUMENTS

| 5,893,962 | A | * | 4/1999 | Mizuno et al. ........... 118/723 E |
| 6,057,247 | A | | 5/2000 | Imai et al. |
| 6,669,807 | B2 | * | 12/2003 | Nakatani ................. 156/345.1 |
| 2002/0079054 | A1 | * | 6/2002 | Nakatani ................. 156/345.1 |
| 2006/0014395 | A1 | * | 1/2006 | Hino et al. ................... 438/712 |

FOREIGN PATENT DOCUMENTS

| JP | 05-129242 | 5/1993 |
| JP | 11-204297 | 7/1999 |
| JP | 2001-023956 | 1/2001 |
| JP | 2001-230239 | 8/2001 |
| JP | 2001-308077 | 11/2001 |
| JP | 2002-111001 | 4/2002 |
| JP | 2002-198356 | 7/2002 |
| KR | 2002-0021329 | 3/2002 |
| KR | 10-2004-0017781 | 2/2004 |

OTHER PUBLICATIONS

Korean Office Action, with English-language translation, dated Jul. 13, 2006.

* cited by examiner

*Primary Examiner*—David E Graybill  
(74) *Attorney, Agent, or Firm*—Buchanan Ingersoll & Rooney PC

(57) ABSTRACT

A method of manufacturing displays, includes at least forming a metal pattern on a surface of an insulating substrate, forming an insulating film on the metal pattern, forming a pattern of a photosensitive resin on the insulating film, and forming a contact hole in the insulating film with the film of a photosensitive resin used as a mask. The forming a contact hole is a dry etching method in which an electric field is generated between a pair of opposed electrodes after an insulating substrate has been mounted on one electrode that includes aluminum in at least a surface thereof. The dry etching method includes forming a contact hole in the insulating film with an outer circumferential portion, which surrounds a region on which the insulating substrate is mounted, of the one electrode covered with an insulating material.

7 Claims, 5 Drawing Sheets

METHOD OF MANUFACTURING DISPLAYS AND APPARATUS FOR MANUFACTURING DISPLAYS

BACKGROUND OF THE INVENTION

1. Field of the Invention

The present invention relates to a method of manufacturing displays, adapted to form a contact hole in an insulating film, which is formed on a surface of an insulating substrate constituting a display, by an etching operation, and an apparatus for manufacturing displays.

2. Description of the Related Art

A method of manufacturing a display has a step of forming a gate electrode wire and a gate electrode on a surface of an insulating substrate, such as a glass substrate, a step of thereafter forming a gate insulating film and a semiconductor layer, and a step of thereafter forming a source electrode wire, a source electrode and a drain electrode to complete a TFT (thin film transistor). A passivation film made of a silicon nitride film and the like is then formed so as to protect the TFT. An inter-layer insulating film made of a transparent resin is then formed, and a contact hole is formed in the passivation film and inter-layer insulating film. Finally, a picture element electrode is formed on the inter-layer film to obtain a TFT array. The picture element electrode is electrically connected to the drain electrode via the contact hole made in the passivation film and inter-layer insulating film.

However, the following problems occur during the step of forming the contact hole in the insulating film. In a contact hole forming step in a related art method of this kind, a so-called dry etching method was generally used in which a voltage was applied between a pair of electrodes to generate an electric field therebetween, and plasma was thereby generated on an insulating substrate to be etched provided on one of the electrodes to thereby carry out a reactive ion etching operation. In order to form a contact hole in an insulating film, such as a silicon nitride film and a silicon oxide film, a fluorine-containing etching gas capable of carrying out a stable, high-accuracy etching operation is generally used. An electrode material for a dry etching unit is generally made of an aluminum alloy as a base material in many cases for the reasons that the aluminum alloy is inexpensive, highly processable, small in weight, and capable of forming alumite on a surface due to the anodic oxidation. In order to improve the uniformity of the etching operation, the electrodes are formed larger than the insulating substrate to be etched.

When an etching operation for forming a contact hole is carried out in an apparatus for manufacturing displays, adapted to carry out such a dry etching operation, a surface of a lower electrode not having insulating substrate mounted thereon and in a non-sheltered state (projected) is exposed to plasma, and an aluminum component of the electrode and fluorine contained in the etching gas react with each other. As a result, nonvolatile reaction product, such as nonvolatile aluminum fluoride is generated and deposited on the surface of the insulating substrate and surroundings. When this nonvolatile reaction product is deposited during the etching operation on the passivation film on a side surface of the contact hole of the insulating substrate, an exposed metal film on a bottom surface of the contact hole, or an inter-layer insulating film, the nonvolatile reaction product forms a mask for the etching operation, so that a rough surface (irregular portion) occurs. When the surface becomes rough, imperfect coverage occurs during the formation of a picture element electrode to cause the breaking of wires and imperfect display of an image to occur.

FIGS. 7A to 7D are sectional views showing a contact hole forming step in a related art display. Referring to FIGS. 7A to 7D, a gate wire 15 is formed on an insulating substrate 3, and then a first insulating film 16, which constitutes a gate insulting film, so as to cover the gate wire. A source wire 17 is then formed on the first insulating film 16. A second insulating film 18 turning into a passivation film is formed, and then an interlayer insulating film 19 made of a transparent resin is formed. FIG. 7A is a sectional view of a display material not yet subjected to an etching operation for forming a contact hole, FIG. 7B is a sectional view of the display material being etched, FIG. 7C is a sectional view of the display material the etching of which is completed, and FIG. 7D is a sectional view of the display material which has been processed with a wet chemical. As shown in FIGS. 7A to 7D, minute recesses and projections 21 are formed on the surfaces of the inter-layer insulating film 19, second insulating film 18 and source wire 17, and those of the inter-layer insulating film 19, second insulating film 18, first insulating film 16 and gate wire 15 due to a nonvolatile reaction product 20 of the aluminum fluoride and the like of the electrode scattered during the etching operation. In such condition, the breaking of a wire occurs due to imperfect coverage when a picture element electrode is formed in a subsequent step. In order to solve these problems, it is necessary to improve the uniformity of the etching operation and prevent the deposition of the nonvolatile reaction product.

In order to solve these problems, a method and an apparatus for manufacturing an insulating substrate constituting a related art display include a reactive ion etching method adapted to generate an electric field between a pair of electrodes by applying a voltage therebetween, and thereby generate plasma on an insulating substrate to be etched provided on one of the electrodes, wherein an insulator covering a surface as a whole of the substrate-side electrode is provided on the same electrode, the insulating substrate being provided in a recess formed in a surface of this insulator so that the surface of the insulating substrate becomes flush with that of the insulator, an etching rate being thereby set uniform over the whole region of the surface of the insulating substrate constituting an etching sample, the deposition of reaction product on the insulating substrate being prevented (refer to, for example, JP-A-5-129242 (FIG. 1)).

However, in the above-described related art method and apparatus for manufacturing displays, an insulator is provided on a substrate-provided side electrode so that this electrode as a whole is covered therewith, and the insulating substrate is provided in a recess formed in a surface of this insulator so that the surface of the substrate is flush with that of the insulator. Therefore, it is necessary that the recess having a height equal to the thickness of the insulating substrate and capable of housing the insulating substrate therein be formed. This causes the forming of the insulator to become troublesome. When etching operations are carried out repeatedly, the surface of the insulator set flush with that of the substrate is also etched to cause the surface of the insulator to become lower than that of the substrate. Thus, it is difficult to maintain a uniform etching rate.

SUMMARY OF THE INVENTION

The present invention has been made in view of these problems, and aims at providing a method of and an apparatus for manufacturing displays, capable of preventing the occurrence of irregularity of the surfaces of an inter-layer film, an insulating film, a gate wire and a source wire which are provided on the insulating substrate when a contact hole is formed in the insulating film formed on the insulating substrate constituting a display, and capable of carrying out a uniform etching operation.

The present invention relates to a method of manufacturing displays, having at least a step of forming a metal pattern on a surface of an insulating substrate, a step of forming an insulating film on the metal pattern, a step of forming a pattern of a photosensitive resin on the insulating film, and a step of forming a contact hole in the insulating film with the film of a photosensitive resin used as a mask, wherein the contact hole-forming method is a dry etching method in which an electric field is generated between a pair of opposed electrodes after an insulating substrate has been mounted on one electrode that contains aluminum in at least a surface thereof, the dry etching method including a step of forming a contact hole in the insulating film with an outer circumferential portion, which surrounds a region on which the insulating substrate is mounted, on the mentioned one electrode covered with insulating material.

According to the present invention, the insulating film formed on the surface of the insulating substrate constituting a display has a simple structure, and permits an etching operation to be carried out efficiently and excellently.

DETAILED DESCRIPTION OF THE INVENTION

Mode of Embodiment 1

Figure 1:
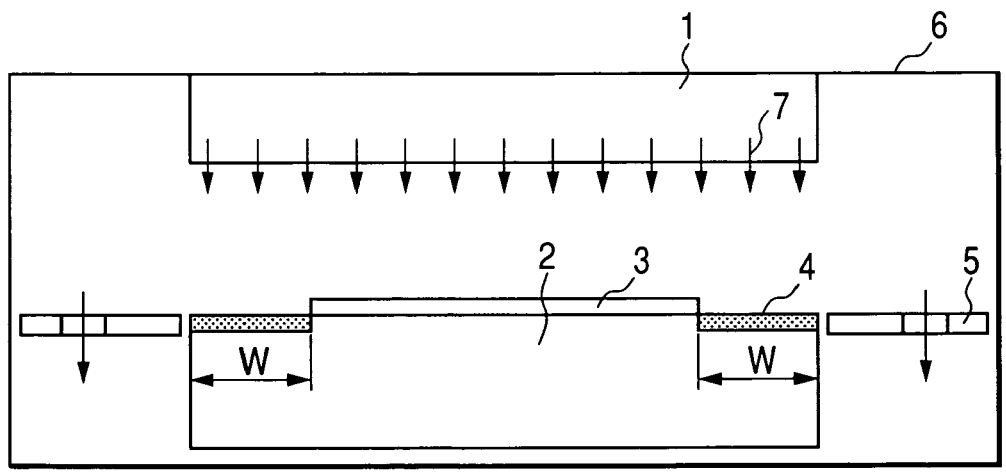
FIG. 1 is a schematic diagram of the apparatus for manufacturing displays in the mode of embodiment 1 of the present invention.

A mode of embodiment 1 of the present invention will be described with reference to FIG. 1. FIG. 1 is a drawing illustrating a method of and an apparatus for manufacturing an insulating substrate constituting a display in the mode of embodiment 1 of the present invention. FIG. 1 shows an outline of a dry etching unit used to carry out a reactive ion etching operation by generating plasma on an insulating substrate, and, in this etching unit, the etching of the insulating film formed on the surface of an insulating substrate 3 mounted on a lower electrode 2 is done by generating an electric field between an upper electrode 1 and the lower electrode 2. The lower electrode 2 is formed so that at least the surface thereof contains aluminum. In this mode of embodiment, a metal pattern formed on the insulating substrate 3 is selectively formed out of Mo, Ta, W, Ti, or an alloy thereof, and an insulating film is formed on the metal pattern. On the surface of the lower electrode 2, an insulating material 4 is provided on an outer circumferential portion on which the insulating substrate is mounted. The insulating material 4 is selectively formed out of a material which is hard to react with plasma, such as a ceramic material not containing aluminum, quartz, SiC, or polyimide having plasma resistance. The width W of a region on which the insulating material 4 is provided is equal in the embodiment of FIG. 1 to that measured from an outer circumferential portion of the surface of the lower electrode 2 on which the insulating substrate 3 is mounted to the outer circumferential portion of the lower electrode 2. This width may be set to around a level at which a nonvolatile reaction product 20, which occurs during a dry etching operation, of the lower electrode corresponding to the outer circumferential portion on which the insulating substrate is mounted does not scatter on the insulating substrate. Referring to FIG. 1, a buffer plate 5 is provided for the purpose of stabilizing air currents 7 of an etching gas in an etching chamber 6 and securing the uniformity of the etching operation for the insulating substrate 3. The buffer plate 5 is preferably formed out of an insulating material.

Figure 8:
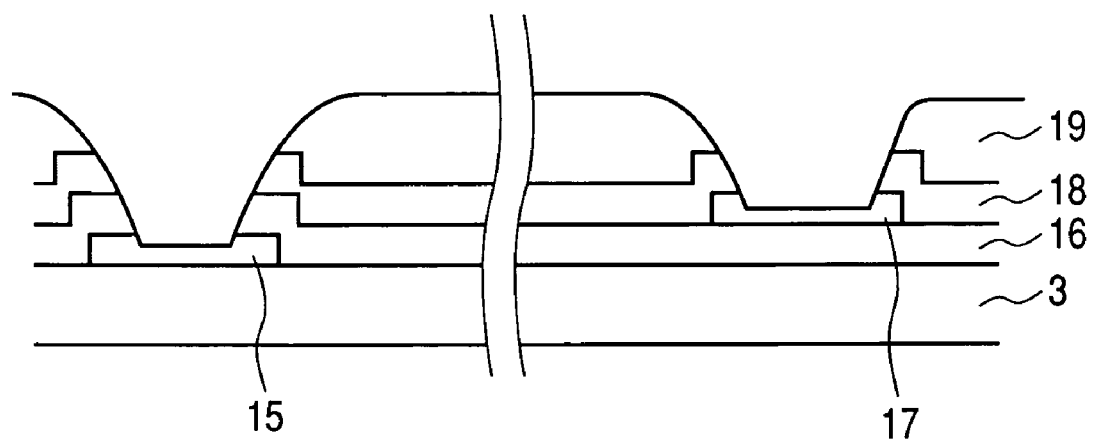
FIG. 8 is a sectional view of the display according to the present invention.

In this mode of embodiment 1, an etching operation is carried out as described above with the insulating material 4 provided on the outer circumferential portion, on which the insulating substrate 3 is mounted, of the surface of the lower electrode 2. Therefore, the etching operation can be carried out without exposing the lower electrode 2 to plasma, so that the scattering and discharge of aluminum components from the lower electrode 2 can be prevented. This enables the occurrence of aluminum fluoride in the etching chamber to be held down even during the formation of a contact hole in the insulating substrate on which a pattern is formed out of Mo, Ta, W, Ti, or an alloy thereof capable of being dry etched by a fluorine-based gas ($CF_4$, $CHF_3$, $CH_2F_2$, $C_4F_8$, $C_5F_6$, etc), the generation of dust due to aluminum fluoride and the occurrence of abnormal shape of an etched portion to be avoided, and an excellent etching operation to be carried out with recesses and projections not formed on the source wire 17, second insulating film 18 and inter-layer insulating film 19 as shown in FIG. 8. Therefore, an excellent etching operation can be carried out.

Mode of Embodiment 2

Figure 2:
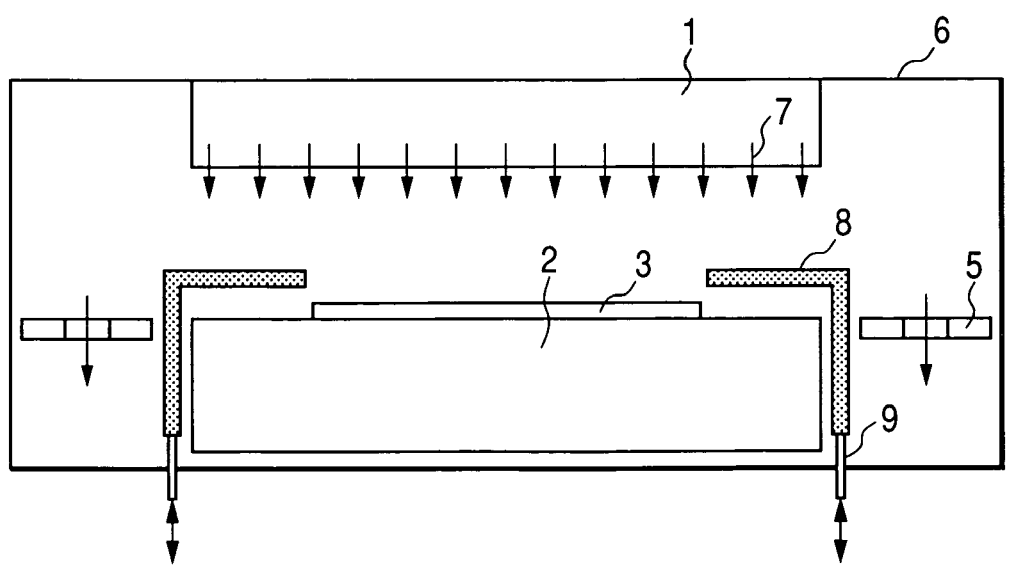
FIG. 2 is a schematic diagram of the apparatus for manufacturing displays in the mode of embodiment 2 of the present invention.
Figure 3:
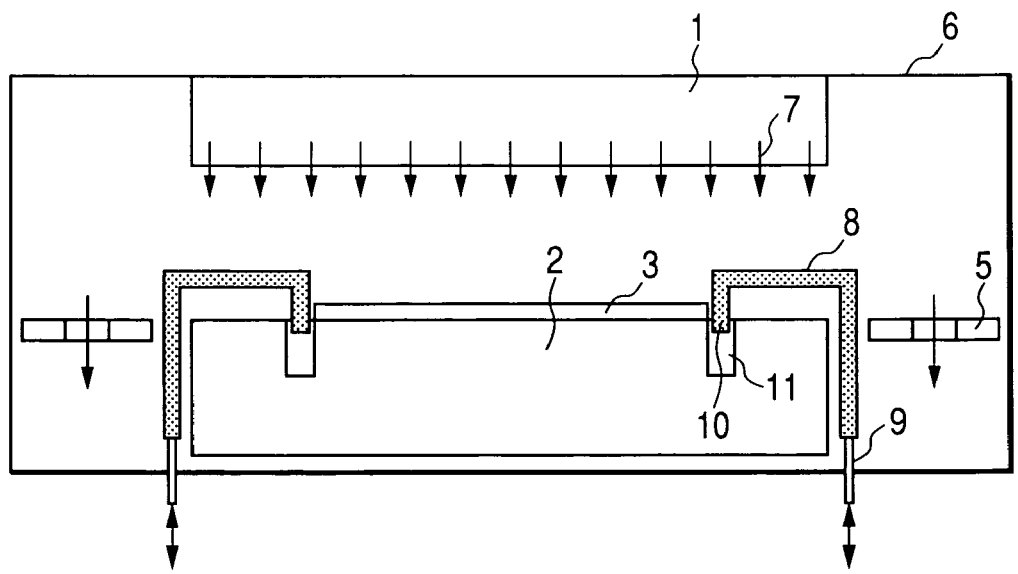
FIG. 3 is a schematic diagram of the apparatus for manufacturing displays in the mode of embodiment 2 of the present invention.
Figure 4:
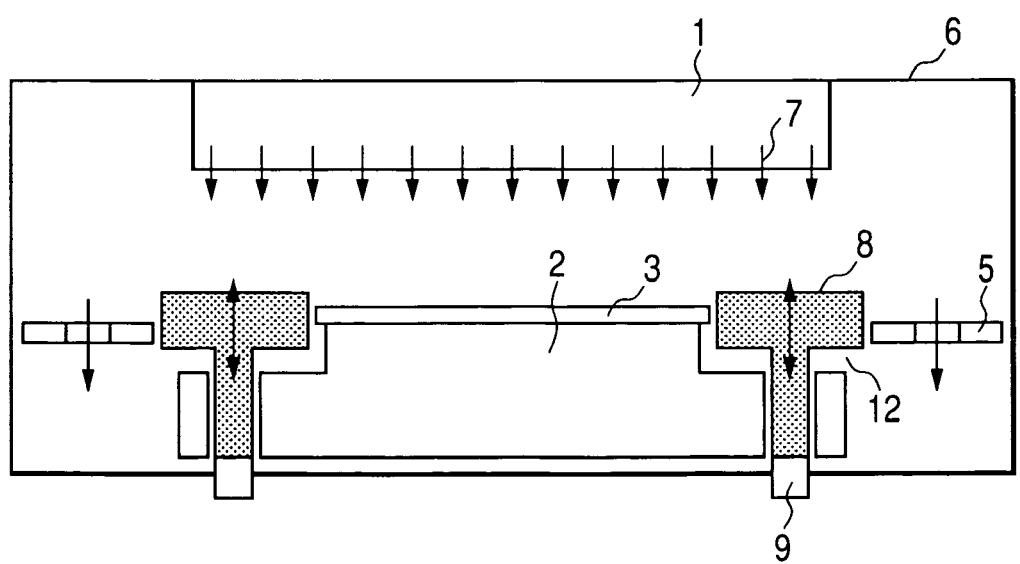
FIG. 4 is a schematic diagram of the apparatus for manufacturing displays in the mode of embodiment 2 of the present invention.

A mode of embodiment 2 of the present invention will be described with reference to FIGS. 2 to 4. FIGS. 2 to 4 are drawings illustrating a method of and an apparatus for manufacturing an insulating substrate constituting a display in a mode of embodiment 2 of the present invention. FIGS. 2 to 4 show an outline of a dry etching unit used to carry out a reactive ion etching operation by generating plasma in the same manner as in the mode of embodiment 1. In the mode of embodiment 2, an insulating film formed on a surface of an insulating substrate 3 mounted on a lower electrode 2 is dry etched, by generating an electric field between an upper electrode 1 and a lower electrode 2.

Referring to FIG. 2 to FIG. 4, the same reference numerals are added to the constituent parts identical with those shown in FIG. 1, and differences between the embodiment 1 and embodiment 2 will be described. FIG. 2 shows an embodiment, in which a protection 8 covering from an upper side of the insulating substrate the surface of an outer circumferential portion of the lower electrode mounted with the insulating substrate 3 is fixed to the lower electrode 2. The material of which the protection 8 is made is selected from insulating materials hard to react with the plasma, such as a plasma resisting ceramic material not containing aluminum, quartz, SiC, or polyimide having plasma resistance. The measurement in the direction of the height of the protection 8 on the surface of the lower electrode can preferably be regulated by a lift mechanism 9 and the like. On the surface of the lower electrode 2, an insulating substrate containing aluminum is generally used.

Since such a structure is employed, an etching operation can be carried out without exposing the lower electrode 2 to plasma, and the occurrence of the scatter and discharge of aluminum components from the lower electrode 2 can be prevented. This enables the occurrence of aluminum fluoride in the etching chamber to be held down, and the generation of dust due to aluminum fluoride, and the irregular shape of an etched portion to be avoided. The position of the protection made of an insulating material can be regulated vertically as mentioned above. When the plasma parameters, such as Vpp and the like are controlled properly by regulating the applied voltage and the position of the protection, a highly accurate etching operation becomes able to be carried out. Moreover, the scatter and discharge of nonvolatile high reaction product of the lower electrode during a dry etching operation can be held down. The protection of an insulating material is also etched during the etching of the insulating substrate, and the sizes thereof become gradually small. However, the protection can be set in a predetermined position suitably with respect to the insulating substrate because the height of the protection can be regulated as mentioned above, so that an etching operation of a high quality and a high accuracy can be carried out.

FIG. 3 shows an embodiment in which a protection 8 is provided at the portion thereof which is close to an insulating substrate 3 with a projection 10, while a lower electrode 2 is provided with a groove 11 which is engaged with the projection 10, in addition to the structure identical with that of the embodiment of FIG. 2. The groove 11 is provided in the lower electrode 2 so as to surround an outer circumferential portion of the insulating substrate 3. When the vertically position-regulatable cover 8 is thus controlled so that the projection 10 formed on the protection 8 and the groove 11 of the lower electrode are engaged with each other, the prevention of the generation of dust ascribed to the nonvolatile reaction product deposited between the protection 8 and lower electrode 2, and abnormal electric discharge between the protection 8 and lower electrode 2 can be attained in addition to the good effect obtained owing to the above-described structure of the embodiment of FIG. 2. This enables a high-quality, high-accuracy etching operation to be carried out.

FIG. 4 shows an embodiment formed by inserting a shaft portion of a protection 8 through a hole made in a lower electrode 2, in addition to the structure identical with that of the embodiment of FIG. 2. An outer circumferential portion of the lower electrode 2 on an outer side of the insulating substrate 3 is provided with a recess 12 adapted to house the protection 8 therein. Since such a structure is employed, the effect identical with those of the structures of FIGS. 2 and 3 can be displayed. In the case of the embodiment of FIG. 4, a shaft can be formed on a substantially central portion of the protection. Therefore, even when the thickness of such a portion of the protection that covers the outer circumferential portion of the lower electrode is increased, the strength of the protection can be secured without causing the protection to be bent. When the thickness of the protection decreases due to an etching operation, the position of the protection is regulated by a lift mechanism 9. As a result, the display can be used for a long period of time, and the productivity thereof can be improved by using one protection.

Mode of Embodiment 3

Figure 5:
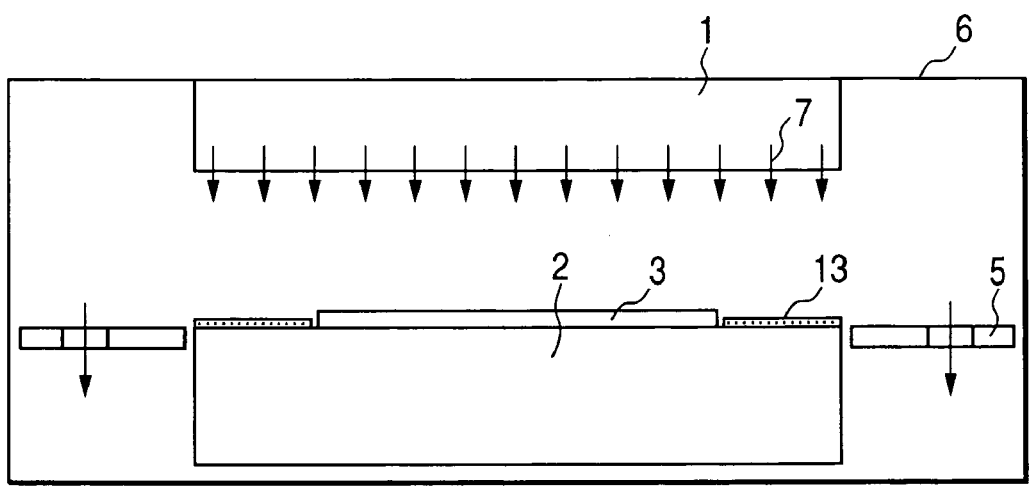
FIG. 5 is a schematic diagram of the apparatus for manufacturing displays in the mode of embodiment 3 of the present invention.

The mode of embodiment 3 of the present invention will be described with reference to FIG. 5. FIG. 5 is a drawing illustrating a method of and an apparatus for manufacturing an insulating substrate constituting a display of the mode of embodiment 3 of the present invention. FIG. 5 shows the outline of a dry etching unit adapted to carry out a reactive ion etching operation by generating plasma in the same manner as in the modes of embodiments 1 and 2. The dry etching unit of FIG. 5 is adapted to dry etch an insulating film formed on a surface of an insulating substrate 3 mounted on a lower electrode 2 by generating an electric field between an upper electrode 1 and lower electrode 2.

Referring to FIG. 5, the same reference numerals are added to the constituent parts identical with those shown in FIGS. 1 to 4, and differences between the parts shown in FIG. 5 and those shown in FIGS. 1 to 4 will be described. In the embodiment of FIG. 5, a film 13 made of an insulating material is provided on an outer circumferential portion of a surface of a lower electrode 2 on which an insulating substrate 3 is mounted. Owing to such a structure employed, an etching operation can be carried out by using an inexpensive film pasted on the lower electrode and without exposing the lower electrode of an aluminum alloy to plasma, and the scatter and discharge of aluminum components from the lower electrode can be prevented. This enables the occurrence of aluminum fluoride in an etching chamber to be prevented, and the generation of dust due to the aluminum fluoride and the occurrence of an etched portion of an abnormal shape to be avoided by a simple structure. When a defective or worn film is replaced with a new film, the detaching and attaching thereof can be done easily, so that the work efficiency improves. Since the insulating material constituting the film is formed out of an insulating material hard to react with plasma, including a ceramic material not containing aluminum, quartz, SiC, or polyimide having plasma resistance, it becomes possible that a more reliable etching operation can be carried out.

Mode of Embodiment 4

Figure 6:
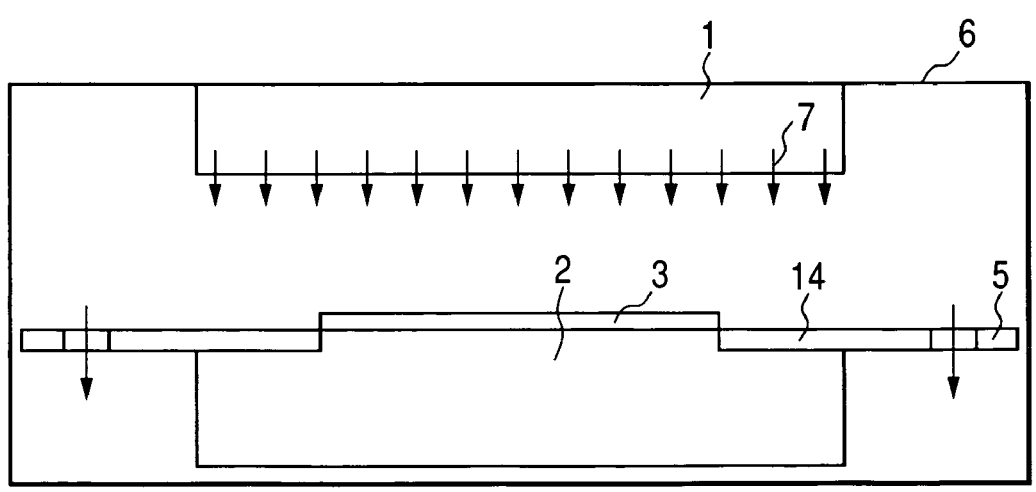
FIG. 6 is a schematic diagram of the apparatus for manufacturing displays in the mode of embodiment 4 of the present invention.
Figure 7A:
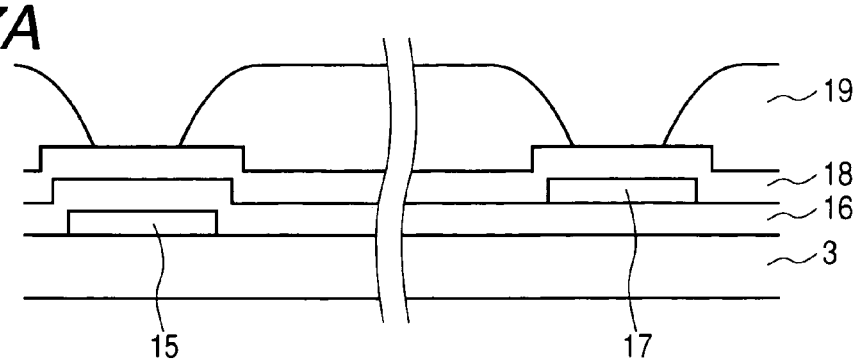
FIGS. 7A to 7D are sectional views of a related art display.
Figure 7B:
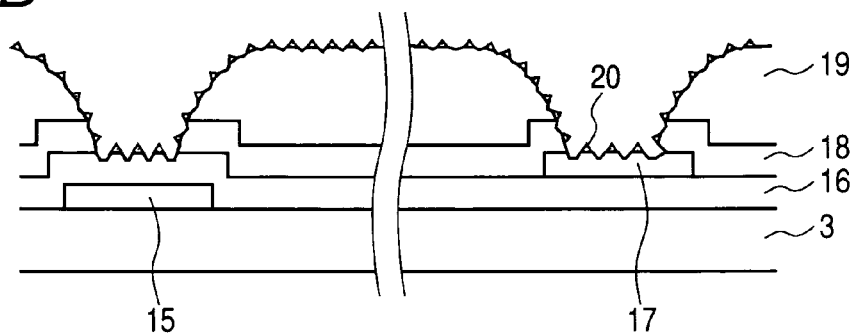
Figure 7C:
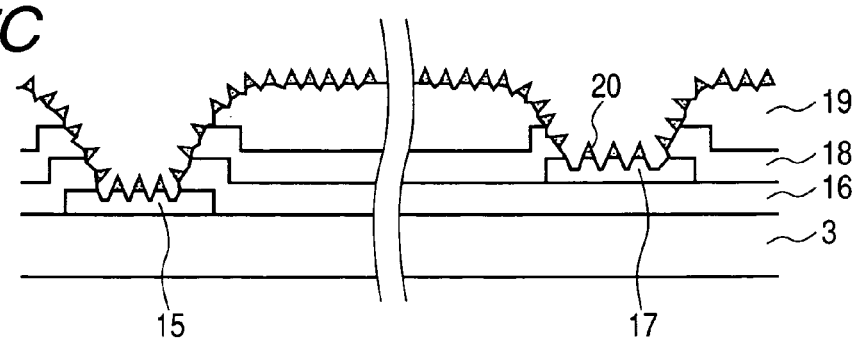
Figure 7D:
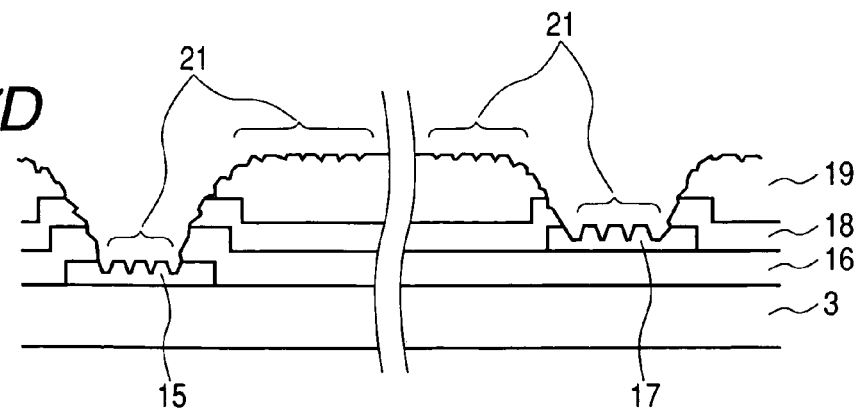

A mode of embodiment 4 of the present invention will be described with reference to FIG. 6. FIG. 6 is a drawing illustrating a method of and an apparatus for manufacturing an insulating substrate constituting a display of the mode of embodiment 4 of the present invention. FIG. 6 shows the outline of an etching unit adapted to carry out a reactive ion etching operation by generating plasma, in the same manner as in the modes of embodiments 1 to 3. In the etching unit in the embodiment of FIG. 6, an electric field is generated between an upper electrode 1 and a lower electrode 2, and an insulating film formed on a surface of an insulating substrate 3 mounted on the lower electrode 2 is dry etched.

Referring to FIG. 6, the same reference numerals are added to constituent parts identical with those shown in FIGS. 1 to 5, and differences between the parts of FIG. 6 and those of FIGS. 1 to 5 will be described. In the embodiment of FIG. 6, a buffer plate 5 is provided so as to extend outward on such a portion of the lower electrode 2, on which the insulating substrate 3 is mounted, that is around an outer circumference of the insulating substrate so as to stabilize air currents in an etching chamber 6 and secure the uniformity of the surface of the insulating substrate 3. An extension 14 of the buffer plate is thus formed. In the embodiment of FIG. 6, a recess is provided in such an outer circumferential portion of the insulating substrate on the lower electrode 2 that is other than a region on which the insulating substrate is mounted, and the extension 14 of the buffer plate is mounted on the recess. But the lower electrode may not have a recess, and may be provided so as to cover the outer surface of the lower electrode therewith. The material of which the extension 14 of the buffer plate is made is preferably selected from insulating materials hard to react with plasma, including a ceramic material not containing aluminum, quartz, SiC, or polyimide having plasma resistance. Since such a structure is employed, the generation of dust due to nonvolatile reaction product deposited between the buffer plate and insulating material can be prevented, so that the occurrence of an imperfect etching operation can be held down.

The above-described mode of embodiments 1 to 4 show a method of and an apparatus for manufacturing displays, and can be applied to all kinds of displays, for example, a liquid crystal or an electroluminescence (EL) which are provided with a contact hole in an insulating film, and which use an insulating substrate.

What is claimed is:

1. An apparatus for manufacturing displays, comprising:
   a pair of opposed electrodes; and
   an insulating substrate mounted on one of the two electrodes, the insulating substrate having an insulating film formed on a surface thereof;
   a voltage applicator configured to apply a voltage between the two electrodes so as to generate an electric field therebetween that causes a contact hole to be formed in the insulating film formed on the surface of the insulating substrate,
   wherein one of the two electrodes is provided with a protection thereon that is formed of an insulating material, the protection being configured to cover, from an upper side of the insulating substrate, an outer circumferential portion of a region of the one electrode on which the insulating substrate is mounted, and being configured to have a position thereof vertically regulatable.

2. The apparatus of claim 1, further comprising a lift mechanism configured to vertically regulate the position of the protection.

3. The apparatus of claim 1, wherein:
   the one electrode on which the insulating substrate is mounted comprises grooves surrounding an outer circumference of the insulating substrate; and
   the protection includes opposing projection portions configured to be detachably engaged in the grooves of the one electrode so as to isolate the outer circumferential portion of the one electrode from the region of the one electrode on which the insulating substrate is mounted.

4. The apparatus of claim 1, wherein the protection is configured to prevent the one electrode from being exposed to plasma generated when the voltage applicator applies the voltage between the two electrodes.

5. The apparatus of claim 1, wherein the insulating material of the protection is formed of a material that is resistant to reaction with plasma generated when the voltage applicator applies the voltage between the two electrodes.

6. The apparatus of claim 1, wherein:
   the one electrode on which the insulating substrate is mounted includes aluminum in at least an upper surface thereof on which the insulating substrate is mounted; and
   the protection is configured to prevent scattering and discharge of aluminum components from the one electrode when the voltage applicator applies the voltage between the two electrodes to cause the contact hole to be formed in the insulating film.

7. The apparatus of claim 1, wherein the protection is mounted in opposing grooves of the one electrode on which the insulating substrate is mounted so as to surround the region of the one electrode on which the insulating substrate is mounted.

* * * * *